(12) United States Patent
Hsu (10) Patent No.: US 7,547,965 B2
(45) Date of Patent: Jun. 16, 2009

(54) PACKAGE AND PACKAGE MODULE OF THE PACKAGE

(75) Inventor: Chi-Hsing Hsu, Shindian (TW)

(73) Assignee: VIA Technologies, Inc., Taipei (TW)

( * ) Notice: Subject to any disclaimer, the term of this patent is extended or adjusted under 35 U.S.C. 154(b) by 324 days.

(21) Appl. No.: 11/410,902

(22) Filed: Apr. 26, 2006

(65) Prior Publication Data
US 2007/0108625 A1    May 17, 2007

(30) Foreign Application Priority Data
Nov. 14, 2005    (TW) .............................. 94139956 A (51) Int. Cl.
*H01L 23/04*    (2006.01)

(52) U.S. Cl. .................. 257/698; 257/685; 257/686; 257/693; 257/773; 257/776; 257/E25.013; 257/E25.031; 257/E23.067; 257/E23.069

(58) Field of Classification Search ................ 257/738, 257/685, 686, 723, 777, E25.005, E25.006, 257/E25.021, E25.027, E23.085, 678–733, 257/774–796, 737, 698
See application file for complete search history.

(56) References Cited

U.S. PATENT DOCUMENTS

| 6,506,632 | B1 | 1/2003 | Cheng et al. | |
| 7,084,513 | B2* | 8/2006 | Matsuki et al. | 257/777 |
| 2003/0134455 | A1* | 7/2003 | Cheng et al. | 438/125 |
| 2004/0178495 | A1* | 9/2004 | Yean et al. | 257/723 |
| 2005/0218518 | A1* | 10/2005 | Jiang et al. | 257/738 |

* cited by examiner

*Primary Examiner*—Jasmine J Clark
(74) *Attorney, Agent, or Firm*—Birch, Stewart, Kolasch & Birch, LLP (57) ABSTRACT

A package includes a carrier, a first chip, a first dielectric layer and at least one first connecting part. The carrier has a first surface and a second surface, and at least one first pad is disposed on the second surface. The first chip is disposed on the first surface. The first dielectric layer is disposed on the first surface and covers the first chip. The first connecting part is disposed in the first dielectric layer and disposed around an edge of the first chip to electrically connect the first chip with the first pad. A package module of the package is also disclosed.

20 Claims, 6 Drawing Sheets

PACKAGE AND PACKAGE MODULE OF THE PACKAGE

BACKGROUND OF THE INVENTION

1. Field of Invention

The present invention relates to a package and a package module of the same, and more particularly to a package and a package module with a shorter electrical connection path.

2. Related Art

With the progress of the technology, the demands on the functional and dimensional limitations for the package and the package module have been relatively enhanced. Consequently, when the package and the package module have to be miniaturized and the amount of the transmitted signals has to be increased, the internal circuit and pads thereof have to be well configured such that the electrical interference in the circuit is avoided, and the layout thereof is simple and easy for assembling and manufacturing.

The conventional package has a chip disposed on a carrier, and the chip may be electrically connected with the carrier in three ways. The first way is a wire bonding method of using a plurality of gold wires to electrically connect the chip with the carrier. However, the various lengths of the gold wires tend to cause the problem of impedance mismatch. Furthermore, the distances between the gold wires during the packaging process cannot be controlled easily. Thus, the interference between the gold wires or the short-circuited phenomenon of the gold wires may be influenced the performance of the package and the defective products. The second way is a flip chip packaging method, which a plurality of bumps are respectively disposed on a plurality of chip pads and then the bumps are mechanically and electrically connected with the carrier. However, the problems of thermal stress and the chip damage tend to occur during the processes of reflowing the bumps and packaging the chip. The third way is a pin through hole (PTH) method, which needle-like or thin-plate-like metal leads are disposed on an edge or a bottom surface of the chip and the carrier has sockets or vias disposed in correspondence with the metal leads, such that the leads can be bonded to the sockets or vias. However, the dimension of the package cannot be easily minimized.

It is therefore an important subject of the present invention to provide a package, a package module and a manufacturing method of the package, which have the advantages of shorter electrical connection path, more flexible packaging and layout, better electrical property, and simpler manufacturing processes, to solve the above-mentioned problems.

SUMMARY OF THE INVENTION

According to one embodiment of the present invention, a package according to the present invention includes a carrier, a first chip, a first dielectric layer and at least one first connecting part. The carrier has a first surface and a second surface, wherein at least one first pad is disposed on the second surface. The first chip is disposed on the first surface. The first dielectric layer is disposed on the first surface and covers the first chip. The first connecting part is disposed in the first dielectric layer and adjacent to an edge of the first chip, wherein the first chip electrically connects with the first pad through the first connecting part.

According to one embodiment of the present invention, a package module according to the present invention has a plurality of packages stacked. One of the packages includes a carrier, a first chip, a first dielectric layer, at least one first connecting part, at least one second pad, and a bump or a solder ball. The carrier has a first surface and a second surface, wherein at least one first pad is disposed on the second surface. The first chip is disposed on the first surface. The first dielectric layer is disposed on the first surface and covers the first chip. The first connecting part is disposed in the first dielectric layer and adjacent to an edge of the first chip, wherein the first chip electrically connects with the first pad through the first connecting part. The second pad is disposed on the first dielectric layer and electrically connected with the first connecting part. The bump or the solder ball is disposed on the second pad to electrically connect with the first pad of another chip or another package.

BRIEF DESCRIPTION OF THE DRAWINGS

The present invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
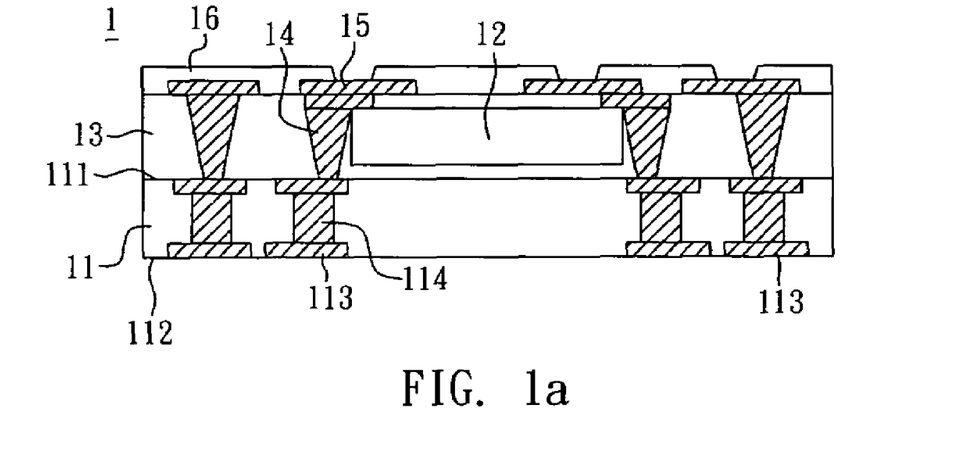
FIGS. 1a and 1b are schematic views showing a package according to the present invention.
Figure 1B:
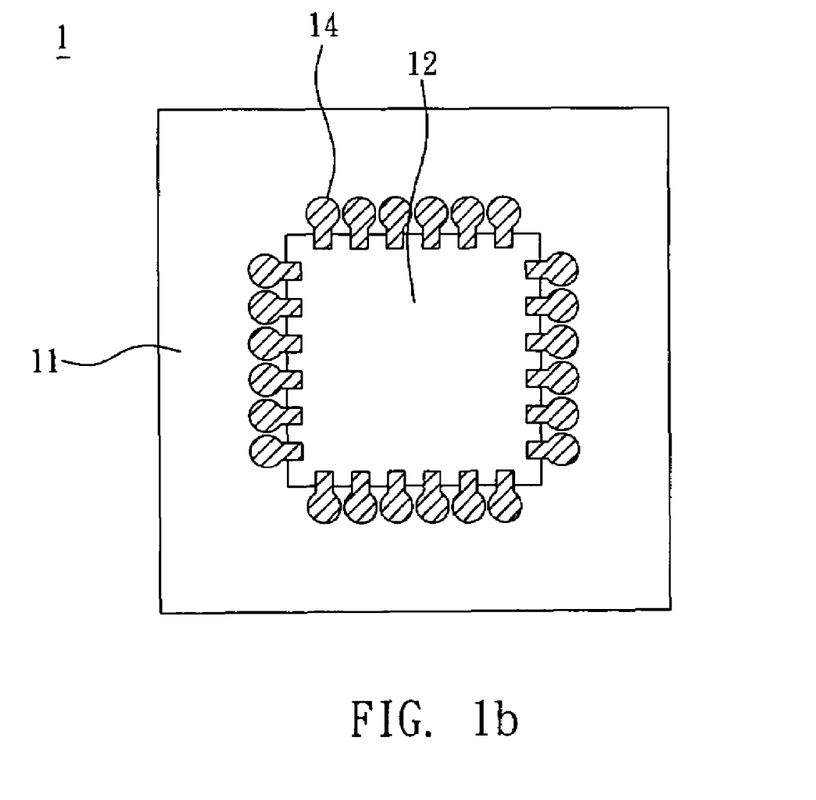

Referring to FIGS. 1a and 1b, a package 1 according to the present invention includes a carrier 11, a first chip 12, a first dielectric layer 13 and at least one first connecting part 14.

The carrier 11 has a first surface 111 and a second surface 112, and at least one first pad 113 is disposed on the second surface 112. In this embodiment, the carrier 11 may be a substrate made of an organic material, an inorganic material or a ceramic material. An internal circuit 114 is disposed in the carrier 11. The carrier 11 may also be a bare substrate having a plurality of through holes (not shown) for those skilled in this art. A conductive material is filled into each of the through holes to form the internal circuit 114. A bump or a solder ball (not shown) may further be disposed on the first pad 113 such that the carrier 11 may be electrically connected with a chip, a package or a circuit board (not shown) through the bump or the solder ball on the first pad 113. On another hand, the carrier 11 may be like a lead frame, which electrically connected to a circuit board through the leads extending from the first pad 113.

The first chip 12 is disposed on the first surface 111 of the carrier 11. The first chip 12 may be a chipset, a processor, a memory, a communication chip or a graphic chip.

The first dielectric layer 13 is disposed on the first surface 111 and covers the first chip 12. The first connecting part 14 is disposed in the first dielectric layer 13 and adjacent to an edge of the first chip 12. The first chip 12 electrically connects with the first pad 113 through the first connecting part 14. More particularly, the first connecting part 14 comprises a conductive via passing through the first dielectric layer 13 and a pad covering a portion of the first chip 12. The conductive via and the pad could be formed together through the same steps in current fabricating process.

In this embodiment, the package 1 further includes at least one second pad 15, which is disposed on the first dielectric layer 13 and electrically connects with the first connecting part 14. The second pad 15 may be electrically connected with the first pad 113 through the first connecting part 14. In addition, the package 1 further includes a protecting layer 16 disposed on the first dielectric layer 13 with the second pad 15 being exposed. The protecting layer 16 protects the electrical connections between the first chip 12 and the first connecting part 14.

The chip 12 is electrically connected with the second pad 15 through the first connecting part 14 or connected with the first pad 113 through the first connecting part 14 in conjunction with the internal circuit 114 of the carrier 11. In other words, the first pad 113 or the second pad 15 may serve as the electrical terminals for the package 1 to connect with other external devices, for example another chip, another package or a circuit board.

Figure 2:
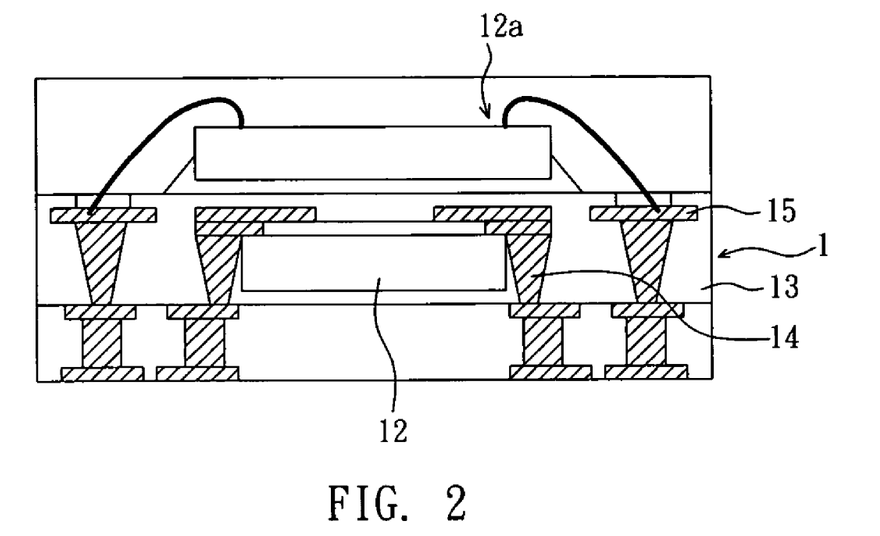
FIG. 2 is a schematic view showing the package according to the present invention electrically connected with another chip.
Figure 3:
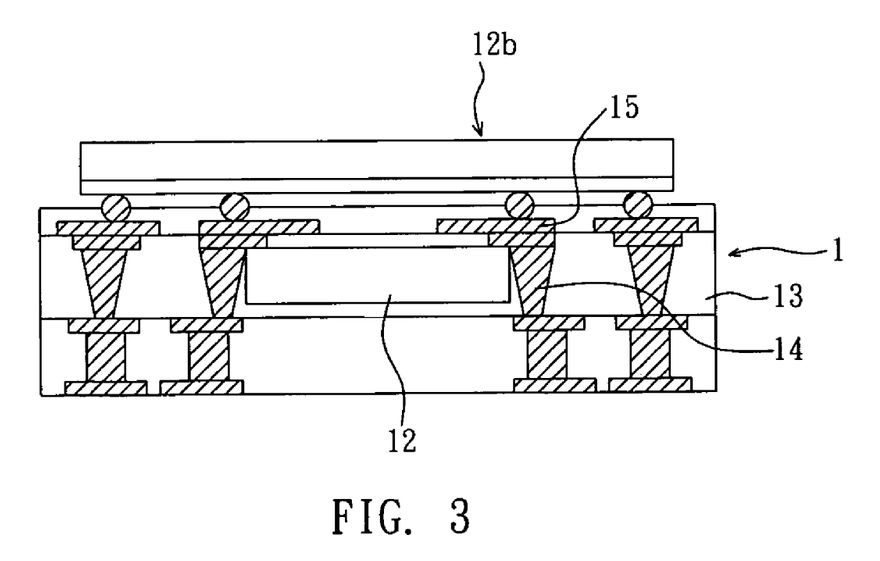
FIG. 3 is a schematic view showing the package according to the present invention electrically connected with another package.

As shown in FIG. 2, another chip 12a may be further stacked on the package 1 to form a stacked multi-chip package (MCP), and the chip 12a is electrically connected to the second pad 15 by way of the wire bonding. Similarly, as shown in FIG. 3, a stacked multi-package module (MPM) may be achieved when another package 12b is stacked on the package 1 and electrically connected to the second pad 15 by way of flip chip packaging.

Therefore, the electrical connection path in the package 1 between the first chip 12 and the carrier 11, between the first chip 12 and the chip 12a, or between the first chip 12 and the package 12b can be shortened. At the same time, the impedance matching of the electrical connection path is improved, and the electrical performance of the package is enhanced. In addition, the package 1 can also provide a more flexible structure and manufacturing method.

Figure 4:
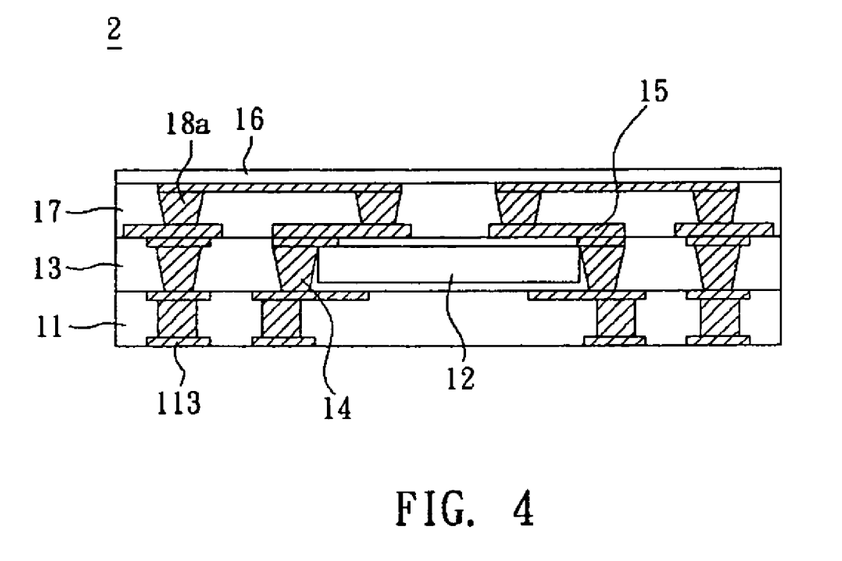
FIG. 4 is a schematic view showing another package according to the present invention.

Referring to FIG. 4, a package 2 includes the elements the same as those of the package 1, a second dielectric layer 17 and a plurality of second connecting parts 18a. The second dielectric layer 17 is disposed on the first dielectric layer 13. The second connecting parts 18a, which are disposed in the second dielectric layer 17, electrically connects the first chip 12 with the first connecting part 14 and then with the first pad 113 through the first connecting part 14. More particularly, one of the second connecting parts 18a comprises two conductive vias passing through the second dielectric layer 17 and a trace disposed on the second dielectric layer 17 connecting the conductive vias. Besides, one of the conductive vias connecting the first chip 12, the other conductive via stacked on the conductive via disposed in the first dielectric layer 13. Thus, the first chip 12 could connect to the carrier 11 through the second connecting part 18a and the conductive via disposed in the first dielectric layer 13. The amount of electrical terminals, which connecting to other external devices, of the first chip 12 can be increased through the second connecting parts 18a and is free from being restricted by the layout density of the first connecting part 14.

Figure 5:
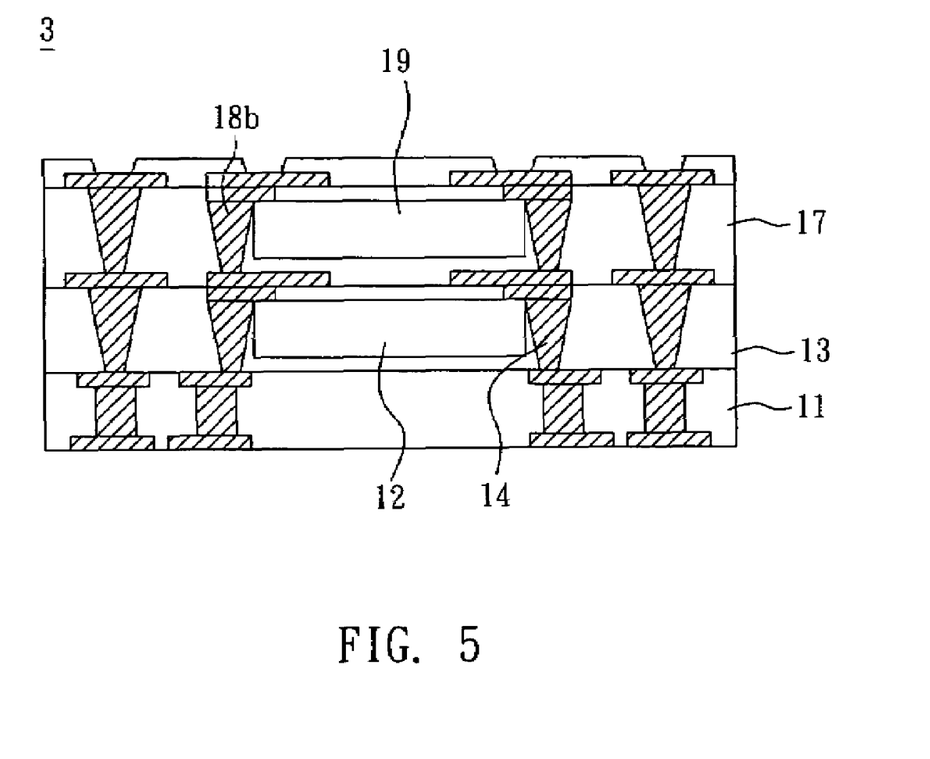
FIG. 5 is a schematic view showing yet another package according to the present invention.

Referring to FIG. 5, a package 3 includes the elements same as those of the package 2 and a second chip 19. Similar to the package 1, the second dielectric layer 17 is disposed on the first dielectric layer 13 and covers the second chip 19. The second connecting parts 18b are formed by the processes the same as those of forming the first connecting part 14. Furthermore, each of the second connecting parts 18b comprises a conductive via stacked on the first connecting parts 14. The second connecting parts 18b are electrically connecting the second chip 19 with the first connecting part 14 to form a stacked multi-chip package (MCP).

The package of the present invention includes but not limited to the first chip 12, the first dielectric layer 13, the second dielectric layer 17 and the second chip 19, and other dielectric layers or chips may be further stacked on the second dielectric layer 17 in accordance with the practical requirement, for example, the technology of forming a bumpless build up layer (BBUL). The thickness of the embodiment of the present invention may be between 0.2 mm and 0.3 mm to meet the trend in the scale for the package technology.

Figure 6:
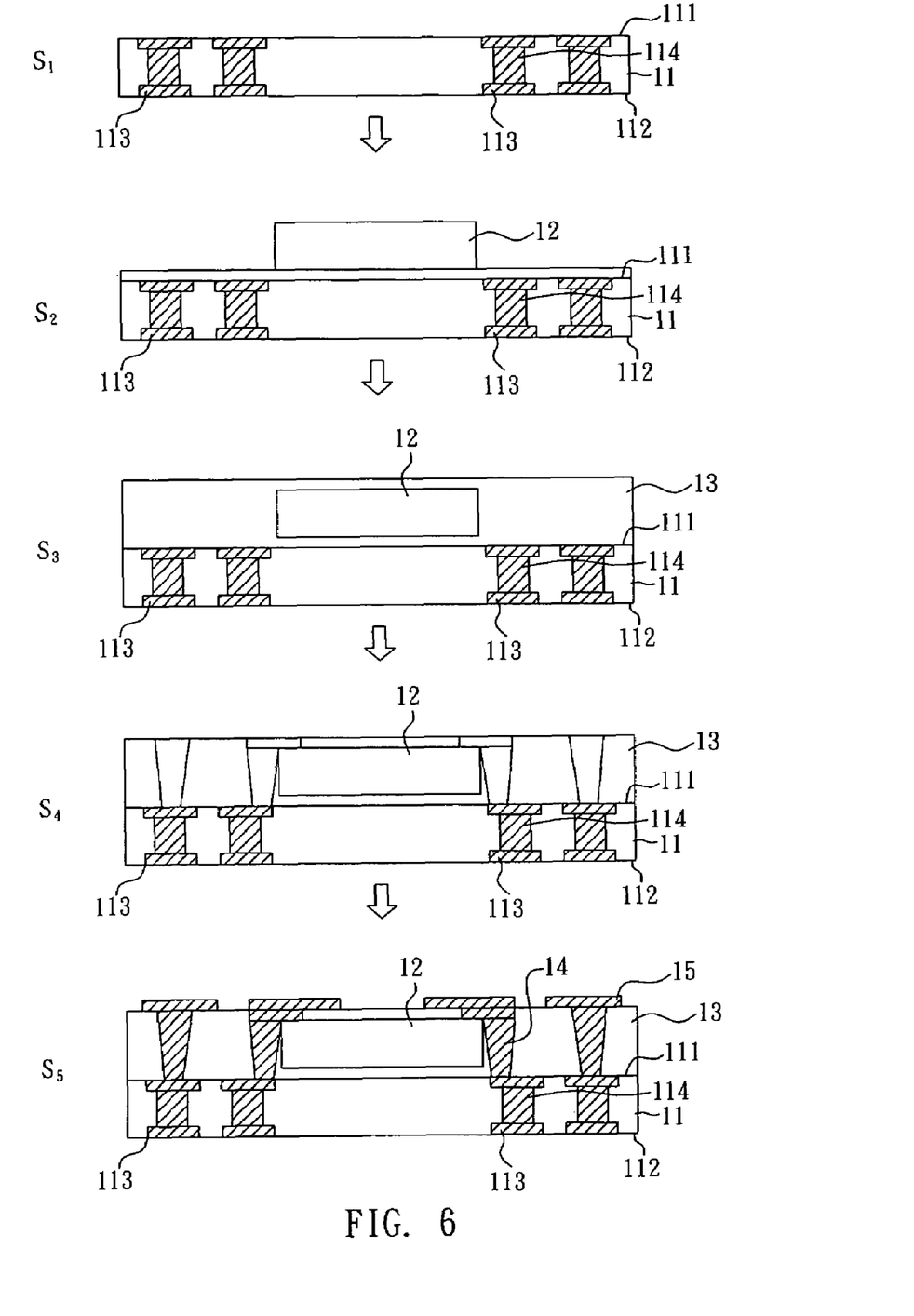
FIG. 6 is a flow chart showing a manufacturing method of the package according to the present invention.

Referring to FIG. 6, a flow chart of a manufacturing method of the package according to the present invention includes the following steps. In step $S_1$, to provide a carrier 11 having a first surface 111 and a second surface 112. In this embodiment, the carrier 11 may be a substrate made of an organic material, an inorganic material or a ceramic material. An internal circuit 114 is disposed in the carrier 11. The carrier 11 may also be a bare substrate having a plurality of through holes (not shown). A bump or a solder ball (not shown) may further be disposed on the first pad 113. In addition, the carrier 11 may be like a lead frame, which electrically connected to a circuit board through the leads extending from the first pad 113.

In step $S_2$, a first chip 12 is disposed on the first surface 111 of the carrier 11. The first chip 12 may be a chipset, a processor, a memory, a communication chip or a graphic chip.

In step $S_3$, a first dielectric layer 13 is formed on the first surface 111 and covers the first chip 12.

In step $S_4$, a portion of the first dielectric layer 13 is removed to expose a portion of the first chip 12 and a portion of the first pad 113 adjacent to an edge of the first chip 12.

In step $S_5$, a conductive material is filled into each of the exposed portions of the first chip 12 and of the first pad 113 to form at least one first connecting part 14. The first chip 12 electrically connects with the first pad 113 through the first connecting part 14. The conductive material may be filled into each of the through holes to form an internal circuit 114 in the carrier 11 during or after step $S_5$ when the carrier 11 is a bare substrate having a plurality of through holes.

In this embodiment, step $S_5$ may further include the sub-step of forming a plurality of second pads 15 on the first dielectric layer 13, and the second pads 15 are electrically connected to the first connecting part 14. The second pad 15 may be electrically connected to another chip 12a (as shown in FIG. 2) or another package 12b (as shown in FIG. 3) by way of the wire bonding or flip-chip packaging.

In this embodiment, the manufacturing method may further include a step of forming a protecting layer 16 (not shown) on the first dielectric layer 13 with the second pad 15 being exposed after step $S_5$.

Referring to FIGS. 4 and 6, the manufacturing method may further include the following steps of forming a second dielectric layer 17 and at least one second connecting part 18a. The steps include: forming the second dielectric layer 17 on the first dielectric layer 13; removing a portion of the second dielectric layer 17 to expose a portion of the first chip 12 and a portion of the first connecting part 14; and filling a conductive material into each of the exposed portions of the first chip 12 and the first connecting part 14 to form the at least one second connecting part 18a. The second connecting part 18a electrically connects the first chip 12 with the first connecting part 14 and then with the first pad 113 through the first connecting part 14.

Referring to FIGS. 5 and 6, the manufacturing method further includes the following steps such that the package further has a second chip 19, a second dielectric layer 17 and at least one second connecting part 18b. The steps include: disposing the second chip 19 on the first dielectric layer 13; forming the second dielectric layer 17 on the first dielectric layer 13 and covering the second chip 19; removing a portion of the second dielectric layer 17 to expose a portion of the second chip 19 and a portion of the first connecting part 14; and filling a conductive material into each of the exposed portions of the second chip 19 and of the first connecting part 14 to form the at least one second connecting part 18b. The second connecting part 18b electrically connects the second chip 19 with the first connecting part 14 and then with the first pad 113 through the first connecting part 14.

Figure 7:
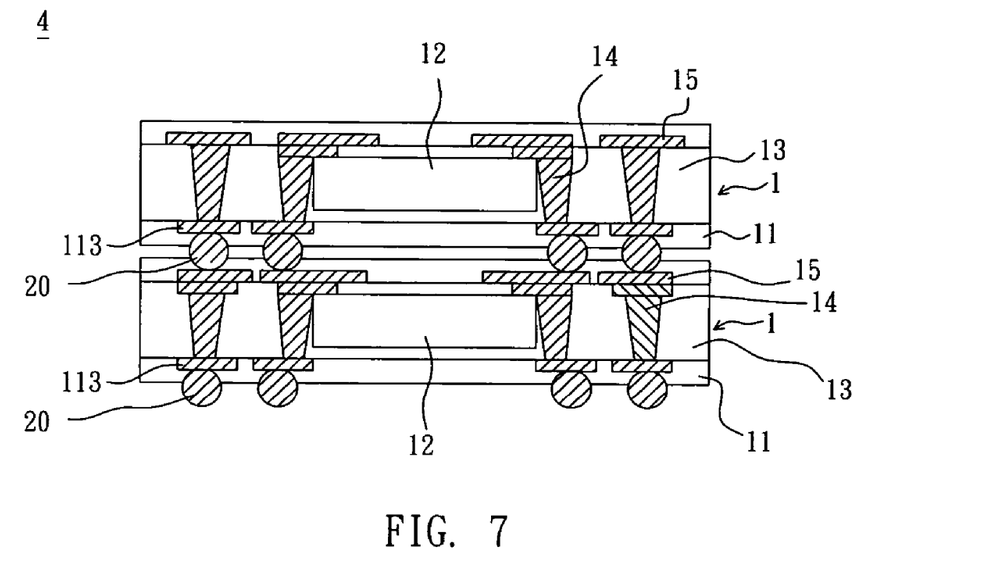
FIG. 7 is a schematic view showing a package module according to the present invention.

Referring to FIG. 7, a package module 4 according to the present invention has two packages 1, which have the same elements and are electrically connected with each other. Each package 1 includes a carrier 11, a first chip 12, a first dielectric layer 13, at least one first connecting part 14, at least one second pad 15, at least one first pad 113 and at least one solder ball 20. The upper package 1 may be connected to the first connecting part 14 of the lower package 1. The carrier 11, the first chip 12, the first dielectric layer 13 and the first connecting part 14 have been described hereinabove, and detailed descriptions thereof will be omitted.

Figure 8:
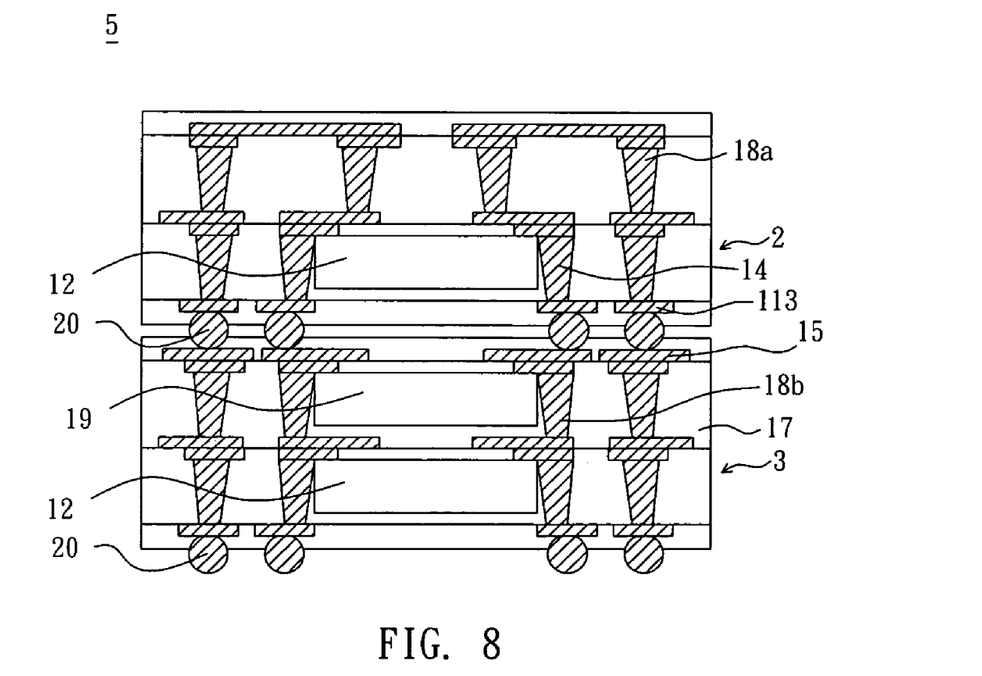
FIG. 8 is a schematic view showing another package module according to the present invention.

Referring to FIG. 8, another package module 5 according to the present invention has two packages 2 and 3, which have different elements and are stacked together. The package 2 has at least one first connecting part 14 and at least one second connecting part 18a serving as the interfaces to connect with other external devices. The package 3 has two chips 12 and 19 stacked together. The package 3 further includes at least one second pad 15, which is disposed on a second dielectric layer 17 and electrically connected to at least one second connecting part 18b. The second pad 15 of the package 3 is further connected to at least one first pad 113 of the package 2 through a solder ball 20.

In summary, because the first connecting part is disposed on the edge of the first chip and achieves a shorter electrical connection path in a package, a package module and a manufacturing method of the package according to the present invention, the first chip can be directly electrically connecting with the carrier, another chip, another package or a circuit board through the first connecting part. Comparing with the prior art, the present invention has the advantages of shorter electrical connection path, more flexible packaging and layout, better electrical property, and is thus advantageous to the processes of manufacturing the package and the package module.

Although the present invention has been described with reference to specific embodiments, this description is not meant to be construed in a pivoting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A package, comprising:
   a carrier having a first surface and a second surface, wherein at least one first pad is disposed on the second surface;
   a first chip disposed on the first surface;
   a first dielectric layer disposed on the first surface and covering the first chip; and
   at least one first connecting part disposed in the first dielectric layer and adjacent to an edge of the first chip, wherein the first chip electrically connects with the first pad through the first connecting part, and wherein the first connecting part comprises a conductive via disposed by the edge of the first chip and passing through the first dielectric layer and a pad covering a portion of the first chip and a portion of the conductive via.

2. The package according to claim 1, further comprising:
   at least one second pad disposed on a surface of the first dielectric layer, wherein the second pad electrically connects with the first connecting part.

3. The package according to claim 2, wherein the first pad electrically connects with an external device through a bump or a solder ball disposed on the first pad.

4. The package according to claim 2, wherein the second pad electrically connects with an external device through a bump or a solder ball disposed on the second pad.

5. The package according to claim 2, further comprising:
   a protecting layer disposed on the first dielectric layer and exposing the second pad.

6. The package according to claim 1, further comprising:
   a second dielectric layer disposed on the first dielectric layer; and
   at least one second connecting part disposed in the second dielectric layer, wherein the second connecting part electrically connects with the first chip.

7. The package according to claim 6, further comprising:
   at least one third connecting part disposed in the first dielectric layer connecting the second connecting part and the carrier.

8. The package according to claim 7, wherein the second connecting part comprises a first conductive via connecting to the first chip, a second conductive via connecting the third connecting part, and a trace disposed on the second dielectric layer connecting the first conductive via and the second conductive via.

9. The package according to claim 1, further comprising:
   a second chip disposed on the first dielectric layer;
   a second dielectric layer disposed on the first dielectric layer and covering the second chip; and
   at least one second connecting part disposed in the second dielectric layer, wherein the second chip electrically connects with the first connecting part through the second connecting part.

10. The package according to claim 9, wherein the second chip electrically connects with the first pad through the first connecting part and the second connecting part.

11. The package according to claim 9, wherein the second connecting part comprises a conductive via stacked on the first connecting part.

12. The package according to claim 9, wherein the second connecting part is adjacent to an edge of the second chip.

13. The package according to claim 1, wherein the carrier is a substrate or a lead frame.

14. A package module comprising:
   a plurality of packages stacked, wherein one of the packages comprises
   a carrier having a first surface and a second surface, wherein at least one first pad is disposed on the second surface;
   a first chip disposed on the first surface;
   a first dielectric layer disposed on the first surface and covering the first chip;

at least one first connecting part disposed in the first dielectric layer and adjacent to an edge of the first chip, wherein the first chip electrically connects with the first pad through the first connecting part;

at least one second pad disposed on the first dielectric layer and electrically connects with the first connecting part; and a bump or a solder ball disposed on the second pad to electrically connect with the first pad of another chip or another package.

15. The package module according to claim 14, wherein one of the packages further comprising:

a protecting layer disposed on the first dielectric layer and exposing the second pad.

16. The package module according to claim 14, wherein one of the packages further comprising:

a second dielectric layer disposed on the first dielectric layer; and at least one second connecting part disposed in the second dielectric layer, wherein the first chip electrically connects with the second connecting part.

17. The package module according to claim 14, wherein one of the packages further comprising:

a second chip disposed on the first dielectric layer;

a second dielectric layer disposed on the first dielectric layer and covering the second chip; and at least one second connecting part disposed in the second dielectric layer, wherein the second chip electrically connects with the first pad through the first connecting part and the second connecting part.

18. The package module according to claim 17, wherein the second connecting part is adjacent to an edge of the second chip.

19. The package module according to claim 14, wherein the carrier is a substrate or a lead frame.

20. The package according to claim 14, wherein the first connecting part comprises a conductive via disposed by the edge of the first chip and passing through the first dielectric layer and a pad covering a portion of the first chip and a portion of the conductive via.

* * * * *